United States Patent
Lisiansky et al.

[11] Patent Number: 5,997,659
[45] Date of Patent: Dec. 7, 1999

[54] METHOD OF TREATMENT OF DEVICES BASED ON SEMICONDUCTOR AND DIELECTRIC MATERIALS

[76] Inventors: Michael Lisiansky; Valentina Korchnoy, both of 77 Hatihon St., Dep. 3, 32584, Haifa, Israel

[21] Appl. No.: 08/916,194

[22] Filed: Aug. 21, 1997

[51] Int. Cl.[6] .................................................. H01L 21/309
[52] U.S. Cl. ................................................................ 148/33
[58] Field of Search ..................... 429/4; 65/396; 204/157.42; 264/442; 438/472; 148/33

[56] References Cited

PUBLICATIONS

S. Wolf and R.N. Tauber "Silicon Processing for the VLSI Era, vol. 1–Process Technology" Lattive Press, Sunset Beach, CA USA p. 109, 1986.
Zdebskil, A.P. et al. "Influence on acoustic and electrical properties of CdS." Sov. Phys. Solid State 29(4),pp. 648–651, Apr. 1987.
Ostrovskil, I.V. and Rozhko, A.Kh. "Acoustic Redistribution of Defects in Crystals" Sov. Phys. Solid State 26(12) pp. 2241–2242, Dec. 1984.
Pavlovich, V.N. "Enhanced Diffusion of Impurities and Defects in Crystals in Conditions of Ultrasonic and Radiative Excitation of the Crystal Lattice" Phys. Stat. Bol. (B). pp. 97–105, 1993.
Vavilov, V.S. "Atomic Migration and Related Changes in Defect Concentration and Structure deu to Electronic Subsystem Excitations in Semiconductors" Physics–Uspekhi pp., 387–392, Jul. 1996.
Arakelyan, V.S. et al. "Redistribution of Point Defects in NaCl under the Influence of the Field of a Standing Ultrasonic Wave" Sov. Phys. Solid State 27(8) p. 1521, Aug. 1985.

*Primary Examiner*—Charles Bowers
*Assistant Examiner*—Craig Thompson

[57] ABSTRACT

The invention provides a method for treating devices based on semiconductor and dielectric materials for improving their electrical, photoelectric, optical, luminescent and noise characteristics, for decreasing internal residual stresses in heterostructures and for increasing the device lifetime and the stability of its parameters. The method comprises subjecting the device to acoustic vibrations in the frequency range of 0.01 to 100 MHz, at an amplitude of relative acoustic strain in the range of $0.2 \cdot 10^{-5}$ to $8 \cdot 10^{-5}$, for a period of at least 0.25 hour.

11 Claims, 5 Drawing Sheets

METHOD OF TREATMENT OF DEVICES BASED ON SEMICONDUCTOR AND DIELECTRIC MATERIALS

BACKGROUND OF THE INVENTION

The present invention relates to the field of semiconductor and dielectric material and devices and to a method of production of such devices. The devices and method may be utilized in the fields of electronics, microelectronics, optoelectronics, electrooptics and related fields. The method of the invention permits improvement of the electrical, photoelectric, optical, luminescent, noise and mechanical parameters of such devices, decreases the level of internal residual stress in heterostructures, and increases the devices' lifetime and the stability of their parameters by changing the defect structure of semiconductor and dielectric materials in a controlled and repeated manner.

DESCRIPTION OF THE RELATED ART

The method of semiconductor device treatment described in U.S. Pat. No. 4,018,626 comprises the backside damage of the semiconductor wafer by means of metallic balls vibrating with sound frequency and following high temperature annealing. Surface damaged in this way functions as a getter for defects from the working region of a wafer. Due to this gettering effect, the volume of a device is cleared from different kinds of defects such as vacancies, interstitials and their complexes, dislocations and stacking faults, which are deteriorating device characteristics.

The method of said U.S. Pat. No. 4,018,626 can be used for treatment of numerous classes of semiconductor devices, leading to improvement of their parameters due to the change of the properties of semiconductor crystals in a controlled and repeated manner. Its disadvantages result from the necessity to damage the semiconductor wafers. Therefore, it is not suitable for treatment of devices and structures in their intermediate and complete stages of production.

The method of silicon wafer backside treatment described in U.S. Pat. No. 5,006,475 differs from the previous method, in that defects on a wafer backside arise from abrading a wafer in vibrating abrasive powder. This method It is known that acoustic waves of power level exceeding a certain threshold value generate new point defects and dislocations in the volume of semiconductor and dielectric materials (crystals). Acoustic treatment in the over-threshold regime results in the deterioration of transport and luminescent parameters of materials. Thus, even though these known methods of acoustic treatment result in the improvement of device characteristics, they have the common drawback of causing mechanical damage to the crystal surface. Therefore, these methods are unacceptable for the treatment of structures in their intermediate and complete stages of production, stages where such treatment is most desirable.

SUMMARY OF THE INVENTION

The present invention provides improvement of electrical, photoelectric, optical, luminescent and noise parameters of devices based on semiconductor and dielectric materials. The invention enables the decrease of internal residual stress in heterostructures, the increase of the device's lifetime, and stability of its parameters. All these benefits result from the acoustic enhanced conversion of point defect structure and dislocation morphology in materials and devices.

The object of the present invention is achieved by subjecting the entire volume of material or device to acoustic vibrations in the frequency range of 0.01 to 100 MHz, at the amplitude of relative acoustic strain in the range of $0.2 \cdot 10^{-5}$ to $8 \cdot 10^{-5}$ for a period of at least 0.25 hour. The acoustic waves in this range are of the sub-threshold level, i.e., they do not generate any new defects in the material. If the amplitude of relative acoustic strain falls outside of the above range, the considerable decrease (or even disappearance) of a positive effect of acoustic treatment is observed.

The physical principles of the effect of acoustic waves of sub-threshold power level on semiconductor and dielectric materials are not understood completely at the present time. The results observed can be explained in the framework of the following hypothesis: Improvement of the device parameters could be a result of the getter effect produced by the vibrating dislocations. These vibrations are very similar to the vibrations of the strengthened string. Usually, dislocations are fixed in a crystal on various kinds of defects, called 'stoppers.' As a result, a vibrating dislocation could be imagined as a consequence of vibrating dislocation segments. Under acoustic deformation, a dislocation can be torn away from these stoppers. In turn, the amplitude of vibrations, as well as the volume of the material seized thereby, increase considerably. The charged vibrating dislocation works as a getter, seizing the point defects in its vicinity. This effect is intensified, due to such acoustically induced processes as diffusion, exchange and conversion of point defects.

When acoustic deformation is lower than one from the chosen interval, acoustic treatment does not tear dislocations away from their stoppers. An amplitude of vibrations of dislocation segments is minute, and therefore, the volume seized by the vibrating dislocation is very small. As a result, the effect of acoustic treatment is negligible. On the other hand, when acoustic deformation of the crystal exceeds the upper limit of the chosen interval, point defects and dislocations are generated in volume and result in the deterioration of device parameters.

It was experimentally found that minimum time for acoustic treatment exceeds 0.25 hour. A time less than 0.25 hour is not sufficient to achieve the considerable positive effect, and this fact perhaps may be explained by limited values of defect diffusivity.

The lifetime and stability of parameters of the majority of devices based on semiconductor and dielectric materials are generally determined by degradation processes taking place in them. Usually the origin of these processes is the conversion and consequent transport of some kinds of defects, particularly mobile ones, existing in initial devices. Internal residual stresses which occur in devices with heterojunction are the other important cause of degradation. The proposed method of acoustic treatment promotes the effective point defect structure conversion, in particular, 'recovery' of defects by means of their annihilation, their motion on sinks of various natures, the relaxation of internal stresses in heterostructures due to changes in dislocation morphology. As a result, the degradation stability of the treated devices improves considerably. Moreover, all results of acoustic treatment are stable in time and irreversible.

The main idea of the present invention is to utilize the macrodefects already existing in the material for collecting microdefects contained in it. Therefore, the invention may be used at various stages of device production. Moreover, it does not require high temperature annealing, because sinks are situated in the nearest vicinity of the point defects. The invention is very actual for unstable materials or materials having a tendency to self-compensation. In these materials, the method according to the present invention, being non-equilibrium, may be extremely effective.

The invention will now be described in connection with certain preferred embodiments with reference to the following illustrative figures so that it may be more fully understood.

With specific reference now to the figures in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Figure 1:
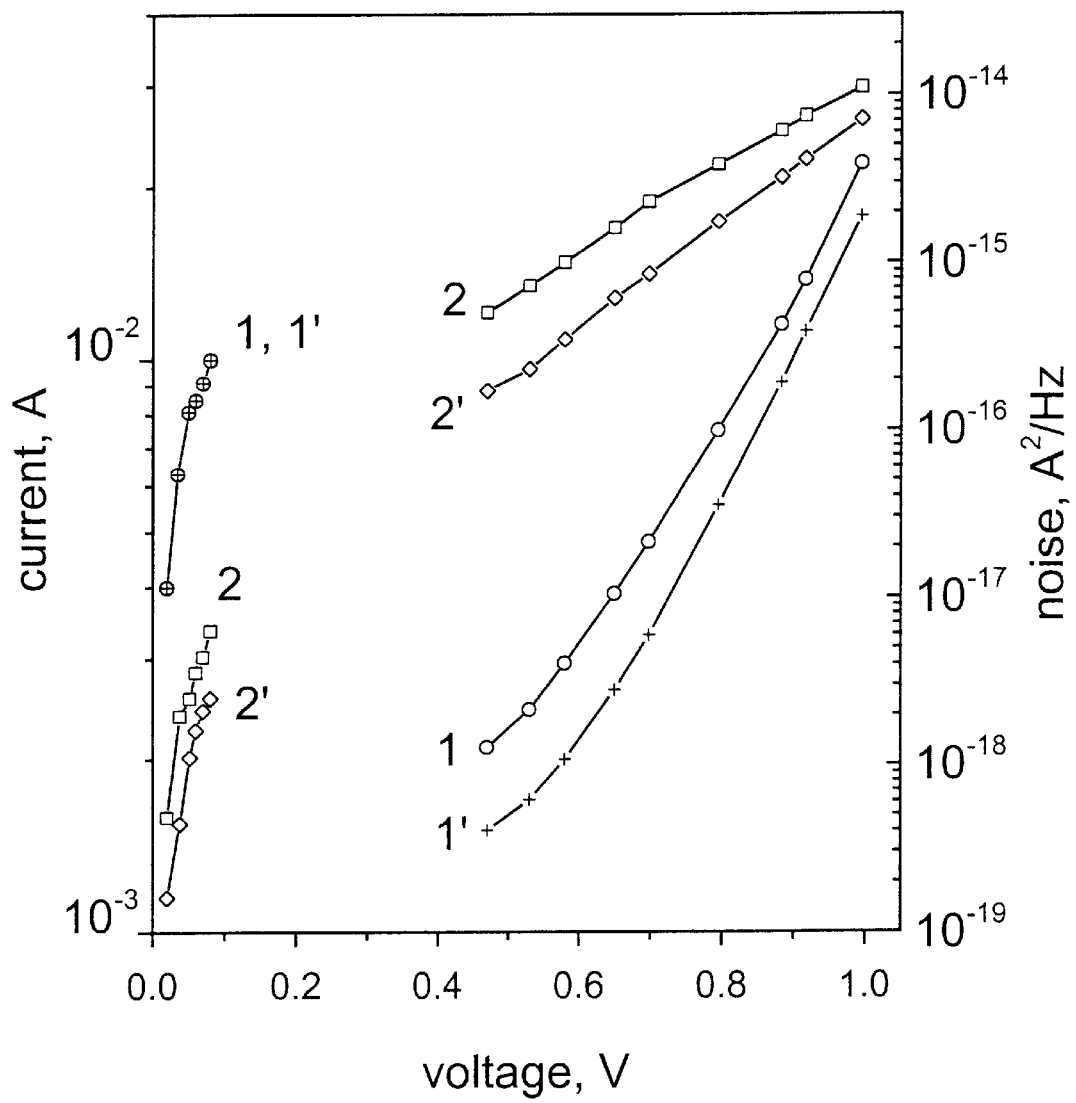
FIG. 1 is a graphic representation of forward voltage-current characteristics (curves 1 and 1') and dependence of a density of the excess current noise (f=300 Hz) on forward bias voltage (curves 2 and 2') in GaAs tunnel diode before (curves 1 and 2') and after (curves 1'and 2') aoustic treatment.

as a function of the applied uniaxial tension (+ε) and compression (−ε) before (curve 1) and after (curve 2) acoustic treatment;

FIG. 4 illustrates an x-ray diffraction pattern of high temperature superconductivity ceramics before (a) and after (b) acoustic treatment, and FIG. 5 illustrates resistance versus temperature dependence of high temperature superconductivitiy ceramics before (a) and after (b) acoustic treatment.

DETAILED DESCRIPTION OF PREFERRED EMBODIMENTS

EXAMPLE 1

The set of InGaAs:Si light-emitting diodes (LEDs) was subjected to acoustic processing in the extended amplitude interval of relative acoustic strain. Some of the LEDs were organized in groups, e.g., 5 units in a group, and each of these groups was treated by acoustic vibrations with a certain amplitude of relative acoustic strain $U_{ac}$. The integrated intensity of LEDs emission before ($L_o$) and after ($L_t$) the treatment was controlled at a constant diode current $I_d$=20 mA by means of a Si photodiode. The results of the acoustic treatment of the set of InGaAs:Si LEDs are demonstrated in Table 1. The represented values of the relative change of emission efficiency, $$\left(\frac{\Delta L}{L_o}\right) \cdot 100\% = (L_t - L_o) \cdot \frac{100}{L_o},$$

are the average results in each group of diodes. The time of acoustic treatment was about 1 hour.

TABLE 1

| $U_{ac}$ | $10^{-6}$ | $2 \cdot 10^{-6}$ | $6 \cdot 10^{-6}$ | $10^{-5}$ | $2 \cdot 10^{-5}$ | $5 \cdot 10^{-5}$ | $8 \cdot 10^{-5}$ | $1.2 \cdot 10^{-4}$ |
|---|---|---|---|---|---|---|---|---|
| $(\Delta L/L_o) \cdot 100\%$ | 2.1 ± 1.8 | 6.5 ± 2.1 | 10.4 ± 3.4 | 18.2 ± 4.4 | 29.7 ± 4.6 | 16.1 ± 2.3 | 5.6 ± 2.4 | −4.3 ± 2.7 |

It is obvious from the obtained data that treatment of LEDs with acoustic vibrations having relative acoustic strain amplitude in the range of $0.2 \cdot 10^{-5}$ to $8 \cdot 10^{-5}$, results in a positive effect. The study of degradation has also been carried out in initial and treated LEDs. It was found that the average lifetime (the time of the double decrease of emission efficiency) of a sample in a treated group was 2.6 times more than that in an untreated group.

The acoustic treatment may be accompanied by the creation of excess majority and minority charged carrier concentrations in the device volume, the level of these concentrations in the working region of the device being in the range of $10^{13}$ to $10^{18}$ cm$^{-3}$.

The creation of the total excess charge carrier concentration is provided by illumination of the device by a light source of predetermined intensity and wavelength or by passing an electric current of predetermined density through the device. Alternatively, the total excess charge carrier concentration can be provided by passing electric current of predetermined density through the device and simultaneously illuminating the device by a light source of predetermined intensity and wavelength. The device acoustic treatment can be accompanied by the provision of the electric field in the volume thereof, the intensity of this electric field in the working region being in the range of 1 to $10^{-6}$ V/cm.

The principal acoustic treatment can follow immediately after a preliminary treatment is accomplished by acoustic vibrations in the frequency range of 0.01 to 100 MHz, at an amplitude of relative acoustic strain in the range of $1 \cdot 10^{-4}$ to $1 \cdot 10^{-3}$, for a period of 1 to 10 seconds. Alternatively, the acoustic treatment can follow or be accompanied by exposure of the device to $^{60}$Co γ-rays flux of less than 1018 quantum /cm$^2$, or irradiation with high energy (up to 500 keV) electron with a flux not exceeding $10^{16}$ electron/cm$^2$.

The acoustic treatment can be accompanied at various intermediate stages of device manufacture, or performed on the raw material used for device manufacture.

EXAMPLE 2

GaAs tunnel diodes were subjected to acoustic treatment at the amplitude of relative acoustic strain in the range of $0.2 \cdot 10^{-5}$ to $8 \cdot 10^{-5}$, for about 0.5 hour. The typical results are shown in FIG. 1. It is seen from the obtained data (compare curves 1 and 1') that acoustic treatment results in the considerable decrease (of 1.4 time) of the excess component of current in a tunnel diode TD (V>0.45 V) (a current of tunnel recombination origin passing through defect levels in a depletion region of a diode).

The density of excess current noise, measured at a frequency f=300 Hz, decreases under acoustic treatment by 2–3 times in the entire region of forward bias (compare curves 2 and 2'). Since the voltage-current characteristics do not vary in the region dominated by band-band current components, it is evident that the main characteristics, height and width, of the barrier through which the carriers tunnel, remain essentially constant during the ultrasonic processing. Hence, the observed changes in diode characteristics (the reduction of the excess current and noise) are caused by the diminution of defect concentration in the space-charge region of TD.

EXAMPLE 3

Figure 2:
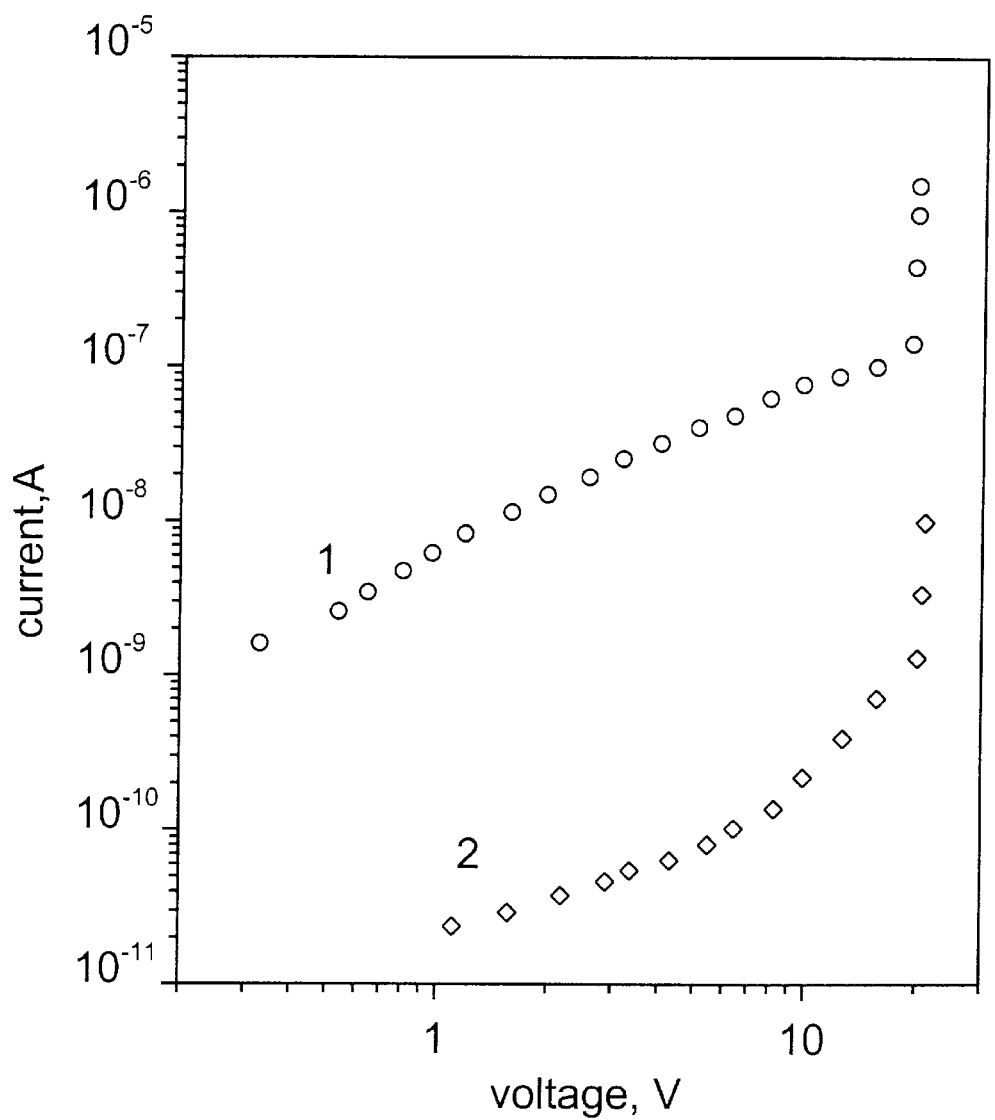
FIG. 2 is a graphic representation of reverse voltage-current characteristics of Si IMPATT diode before (curve 1) and after (curve 2) acoustic treatment.

FIG. 2 demonstrates the typical result of acoustic treatment of Si IMPATT diode, which is a device with p-i-n structure. Ultrasonic processing of Si IMPATT diodes was carried out at an amplitude of relative acoustic strain in the range of $0.2 \cdot 10^{-5}$ to $8 \cdot 10^{-5}$ during 0.5 hour. As seen by comparing curves 1 and 2, acoustic treatment causes a considerable (more than 2 orders) decrease of the reverse (leakage) current of a diode. This current results from the impact ionization of defects located in the i-region of a diode by carriers generated in that region. The reduction of the leakage current is evidence that defect concentration in the i-region decreases under acoustic treatment.

EXAMPLE 4

Figure 3:
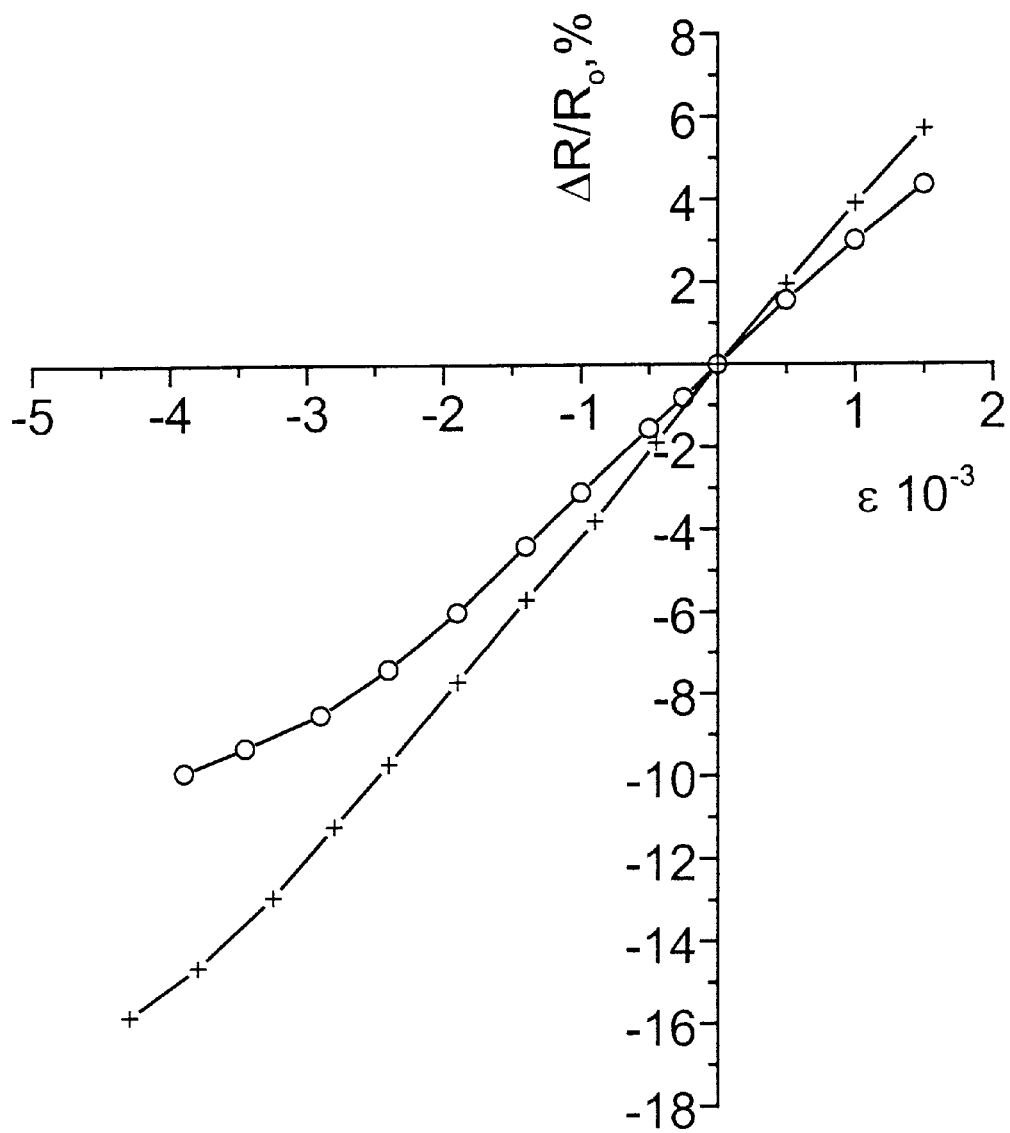
FIG. 3 illustrates the dependence of the tenso-resistance coefficient of the Ge film $$\frac{\Delta R}{R(0)} = \frac{R(\varepsilon) - R(0)}{R(0)}$$

FIG. 3 illustrates the typical result of acoustic treatment of the heterosystem Ge/GaAs (the single crystal film of p-Ge with the thickness d=1–3 μm on GaAs(100) substrate. Highly efficient strain gauges based on this heterosystem were subjected to acoustic treatment at a amplitude of relative acoustic strain in the range of $0.2 \cdot 10^{-5}$ to $8 \cdot 10^{-5}$ during 1 hour. The dependence of the tenso-resistance coefficient of the Ge film $$\frac{\Delta R}{R(0)} = \frac{R(\varepsilon) - R(0)}{R(0)}$$

as a function of the applied uniaxial tension (+ε) or compression (−ε) is depicted. As seen from the initial characteristic of a gauge (curve 1), the linear section of the dependence $$\left[\frac{\Delta R}{R(0)}\right](\varepsilon)$$

extends up to the uniaxial compression $2 \cdot 10^{-3}$. After acoustic treatment, this section expands to the compression of $3.5 \cdot 10^{-3}$ (curve 2). By comparing curves 1 and 2, it is seen that acoustic treatment increases the gauge sensitivity, which is characterized by the slope of the dependence $$\left[\frac{\Delta R}{R(0)}\right](\varepsilon).$$

The above-mentioned changes of the gauge parameters are caused by the relaxation of internal residual mechanical stresses in the heterosystem, up to 40% of the initial level. These stresses result, generally, from a lattice mismatch of the film and the substrate. Acoustic treatment stimulates conversion of the dislocation morphology at the nearest vicinity of the hetero-boundary. This conversion leads to the significant relaxation of internal stresses in the heterosystem.

EXAMPLE 5

FIGS. 4 and 5 demonstrate the effect of acoustic treatment of about 1 hour on high temperature superconductivity ceramics, which is a very unstable material. Powders of $Bi_2O_3$, $SrCO^3$, $CaCO^3$ and CuO, PbO, Sb2O5 were weighed to fix the normal cation ratio to Bi:Pb:Sb:Sr:Ca:Cu= 1.6:0.6:0.1:2:2:3, in order to produce the samples of high temperature superconductivity ceramics with stoichiometry 2223. The powder was mixed with organic formulation and the resulting slurry was subjected to high temperature annealing.

Figure 4A:
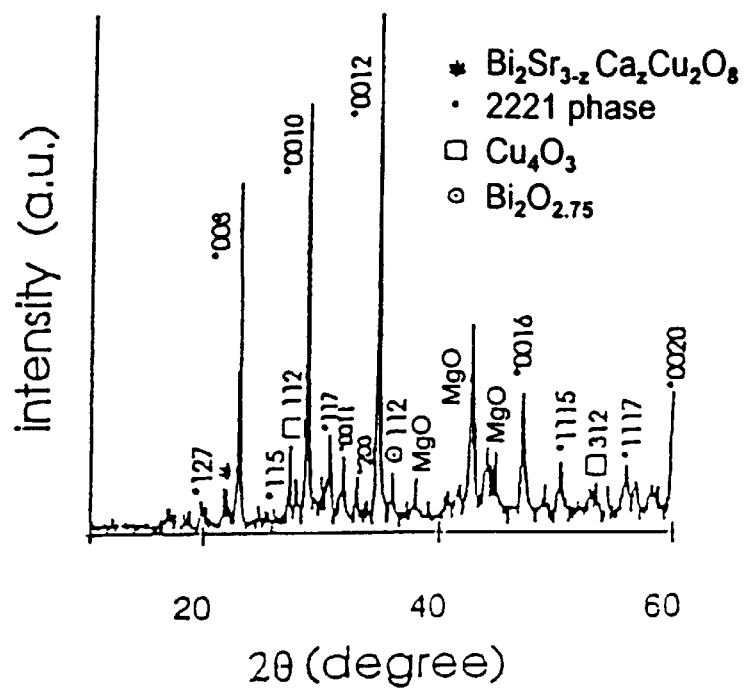
Figure 4B:
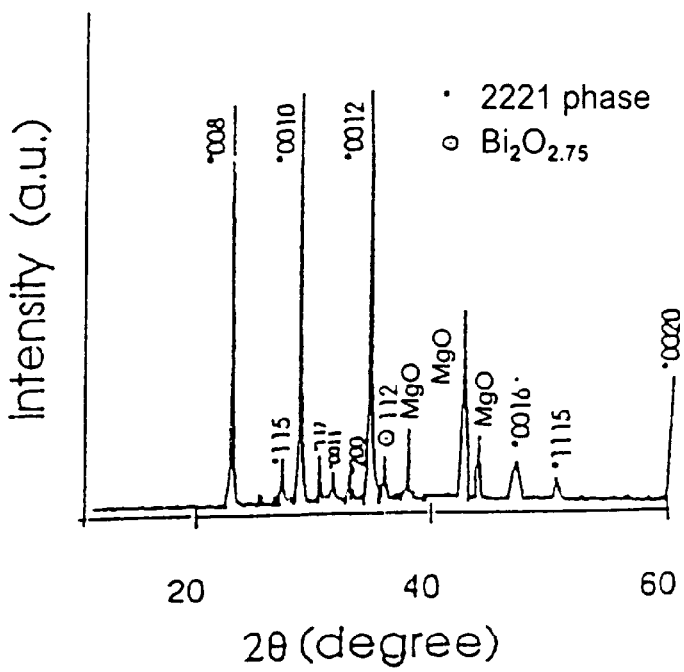
Figure 5A:
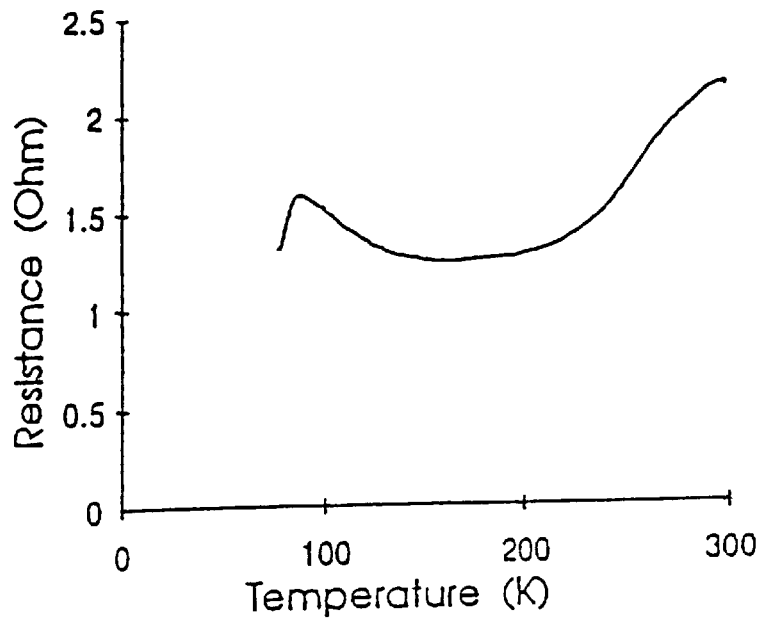
Figure 5B:
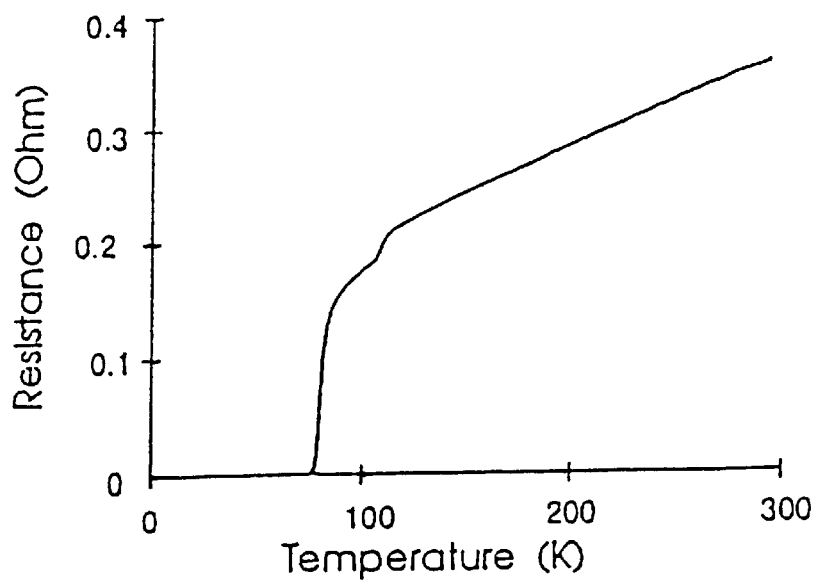

X-ray diffraction (XRD) pattern and resistance versus temperature curve for producing a sample in such a way are shown in FIGS. 4(a) and 5(a), respectively. The characteristics of the sample, after the acoustic treatment at an amplitude of relative acoustic strain, in the range of $0.2 \cdot 10^{-5}$ to $8 \cdot 10^{-5}$, are shown in FIG. 4(b) and FIG. 5(b).

Although the samples investigated were prepared with stoichiometry of 2223, it is seen from FIG. 4(a) that there were no evidences of the 2223 phase at the XRD pattern of untreated samples. The dependence of resistance on temperature of this sample also indicates the presence of only 2212 and semiconducting phases that may result from the 2223 phase composition, due to partial melting processing [FIG. 5 (a)]. The recovery of high temperature superconductivity phase 2223 from its decomposition products in principle may be implemented by long time high temperature annealing for about several days. Resistance versus temperature curve of an acoustic treated sample in FIG. 5(b) demonstrates that acoustic treatment results in the modification of the sample phase composition, in particular, the formation of the 2223 phase, and probably the disappearance of the semiconducting phase. That is supported also by the transformation of the XRD pattern [see FIG. 4(b)]. These results indicate that acoustic treatment promotes the process of formation of a high temperature 2223 phase from low temperature phases.

It will be evident to those skilled in the art that the invention is not limited to the details of the foregoing illustrated embodiments and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A method for treating devices based on semiconductor and dielectric materials for improving their electrical, photoelectric, optical, luminescent and noise characteristics, for decreasing internal residual stresses in heterostructures and for increasing the device lifetime and the stability of its parameters, said method comprising:

subjecting the device to acoustic vibrations in the frequency range of 0.01 to 100 MHz, at an amplitude of relative acoustic strain in the range of $0.2 \cdot 10^{-5}$ to $8 \cdot 10^{-5}$, for a period of at least 0.25 hour.

2. The method as claimed in claim 1, wherein said acoustic treatment is accompanied by the creation of excess majority and minority charge carrier concentrations in the device volume, the level of these concentrations in the working region of said device being entirely in the range of $10^{13}$ to $10^{18}$ cm$^{-3}$.

3. The method as claimed in claim 2, wherein the creation of the total excess charge carrier concentrations is provided by passing an electric current of predetermined density through said device.

4. The method as claimed in claim 2, wherein the creation of the total excess charge carrier concentrations is provided by illumination of said device by a light source of predetermined intensity and wavelength.

5. The method as claimed in claim 2, wherein the creation of the total excess charge carrier concentration is provided by passing an electrical current of predetermined density through said device, and simultaneous illumination of said device by a light source of predetermined intensity and wavelength.

6. The method as claimed in claim 1, wherein said acoustic treatment is accompanied by the creation of an external electrical field in the device volume, the intensity of this electric field in the working region of said device being in the range of 1 to $10^6$ V/cm.

7. The method as claimed in claim 1, wherein the principal acoustic treatment follows immediately after a preliminary treatment is accomplished by said acoustic vibrations in the frequency range of 0.01 to 100 MHz, at an amplitude of relative acoustic strain in the range of $1 \cdot 10^{-4}$ to $1 \cdot 10^{-3}$, for a period of 1 to 10 seconds.

8. The method as claimed in claim 1, wherein said acoustic treatment follows the exposure of said device to $^{60}$Co γ-rays flux less than $10^{18}$ quantum/cm$^2$, or irradiation with high energy (up to 500 keV) electrons, with flux less than $10^{16}$ electron/cm$^2$.

9. The method as claimed in claim 1, wherein said acoustic treatment is accompanied by exposure of said device to 60 Co γ-rays flux less than $10^{18}$ quantum/cm$^2$, or irradiation with high energy up to 500 keV electrons, with flux less than $10^{16}$ electron/cm$^2$.

10. The method as claimed in claim 1, wherein said acoustic treatment is accomplished at various intermediate stages of the manufacture of said device.

11. The method as claimed in claim 1, wherein said acoustic treatment is performed on the raw material used for the manufacture of said device.

* * * * *